United States Patent
Beack et al.

(10) Patent No.: US 7,605,722 B2
(45) Date of Patent: Oct. 20, 2009

(54) LOSSLESS AUDIO CODING/DECODING APPARATUS AND METHOD

(75) Inventors: Seung Kwon Beack, Seoul (KR); Jeongil Seo, Daejeon (KR); Inseon Jang, Daejeon (KR); Dae Young Jae, Daejeon (KR); Hochong Park, Seongnam (KR); Sang-One Kang, Seongnam (KR); Young-Cheol Park, Wonju (KR); Jin Woo Hong, Daejeon (KR)

(73) Assignees: Electronics and Telecommunications Research Institute, Daejeon (KR); Yonsei University Office of Research Affairs, Seoul (KR); Hanyang University Industry-University Cooperation Foundation, Seoul (KR); Kwangwoon University Industry-Academic Collaboration Foundation, Seoul (KR)

( * ) Notice: Subject to any disclaimer, the term of this patent is extended or adjusted under 35 U.S.C. 154(b) by 0 days.

(21) Appl. No.: 12/101,545

(22) Filed: Apr. 11, 2008

(65) Prior Publication Data
US 2008/0284623 A1    Nov. 20, 2008

(30) Foreign Application Priority Data
May 17, 2007    (KR) .................. 10-2007-0048302

(51) Int. Cl.
H03M 7/00    (2006.01)
(52) U.S. Cl. ........................ 341/50; 704/203
(58) Field of Classification Search ............ 341/50–90; 704/201, 203, 229, 230, 503
See application file for complete search history.

(56) References Cited

U.S. PATENT DOCUMENTS

| | | | | |
|---|---|---|---|---|
| 6,148,288 A | * | 11/2000 | Park | .................... 704/500 |
| 6,223,162 B1 | | 4/2001 | Chen et al. | |
| 6,300,888 B1 | | 10/2001 | Chen et al. | |

(Continued)

FOREIGN PATENT DOCUMENTS

JP    2001-007704 A    1/2001

(Continued)

OTHER PUBLICATIONS

B. Bessette, et al; "A Wideband Speech And Audio Codec At 16/24/32 KBITS/S Using Hybrid ACELP/TCX Techniques", Speech Coding Proceedings, 1999 IEEE Workshop on, 1999-ieeexplore.ieee.org; pp. 7-9.

(Continued)

*Primary Examiner*—Lam T Mai
(74) *Attorney, Agent, or Firm*—Ladas & Parry LLP (57) ABSTRACT

Provided are a lossless audio coding/decoding apparatus and method. The lossless audio coding apparatus includes a first coder to directly code first symbols; a second coder module comprising a plurality of second coders to convert the first symbols into second symbols and to code the second symbols; a first selector to compare the performance of the first coder to the performance of the second coders and to output a coding mode in accordance with a comparison result; and a second selector to output a final bitstream by coding the first symbols in correspondence with the coding mode. According to the present invention, the performance of audio coding may be improved.

26 Claims, 7 Drawing Sheets

U.S. PATENT DOCUMENTS

| | | | |
|---|---|---|---|
| 6,480,829 B2 * | 11/2002 | Heo | 704/503 |
| 6,675,148 B2 * | 1/2004 | Hardwick | 704/500 |
| 7,209,056 B2 * | 4/2007 | Moriya et al. | 341/51 |
| 7,230,551 B2 * | 6/2007 | Moriya et al. | 341/51 |
| 7,317,407 B2 * | 1/2008 | Moriya et al. | 341/51 |
| 2003/0171919 A1 * | 9/2003 | Kim et al. | 704/229 |
| 2005/0203731 A1 * | 9/2005 | Oh et al. | 704/203 |
| 2005/0261892 A1 * | 11/2005 | Makinen et al. | 704/200.1 |
| 2009/0030678 A1 * | 1/2009 | Kovesi et al. | 704/230 |

FOREIGN PATENT DOCUMENTS

| | | |
|---|---|---|
| KR | 1020010001891 A | 1/2001 |
| KR | 20020061070 A | 7/2002 |
| KR | 1020050112796 A | 12/2005 |
| KR | 1020070009340 A | 1/2007 |

OTHER PUBLICATIONS

Heiko Purnhagen, "Advances in Parametric Audio Coding", 1999 IEEE Workshop on Applications of Signal Processing to Audio and Acoustics, New Paltz, New York, Oct. 1999.

* cited by examiner

|  |  | INPUT #1 | INPUT #2 |
|---|---|---|---|
| AVERAGE NO. OF BITS IN CONVENTIONAL AUDIO CODING | | 1079.9 BITS | 1051.6 BITS |
| AUDIO CODING ACCORDING TO PRESENT INVENTION | SELECTION FREQUENCY OF MODE 0 | 26.0% | 81.0% |
| | SELECTION FREQUENCY OF MODE 1 | 74.0% | 19.0% |
| | AVERAGE NO. OF BITS | 1033.9 BITS | 1047.5 BITS |
| | BIT REDUCTION RATE | 4.3% | 0.4% |

LOSSLESS AUDIO CODING/DECODING APPARATUS AND METHOD

CROSS-REFERENCE TO RELATED PATENT APPLICATION

This application claims the benefit of Korean Patent Application No. 10-2007-0048302, filed on May 17, 2007, in the Korean Intellectual Property Office, the disclosure of which is incorporated herein in its entirety by reference.

BACKGROUND OF THE INVENTION

1. Field of the Invention

The present invention relates to an audio coding/decoding process, and more particularly, to a lossless coding/decoding apparatus and method for quantization indices of spectral coefficients.

The present invention is derived from a research project by the Information Technology (IT) Research & Development (R&D) program of the Ministry of Information and Communication (MIC) and the Institute for Information Technology Advancement (IITA) [2005-S-005-01], Development of Richmedia Broadcasting technologies through Advanced Audio and Video Codec technologies]

2. Description of the Related Art

Figure 1A:
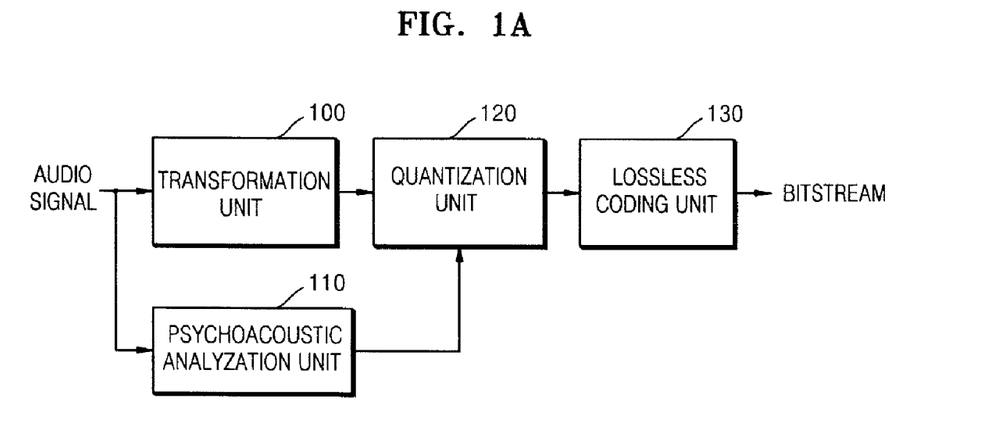
FIG. 1A is a block diagram for explaining a general concept of an audio coder.

FIG. 1A is a block diagram for explaining a general concept of an audio coder that is widely used in MPEG-1 audio layer-3 (MP3), advanced audio coding (AAC) codecs and so on. Referring to FIG. 1A, the audio coder includes a transformation unit 100, a psychoacoustic analyzation unit 110, a quantization unit 120, and a lossless coding unit 130.

The transformation unit 100 transforms an audio signal from the time domain to the frequency domain so as to generate spectral coefficients. The psychoacoustic analyzation unit 110 analyzes acoustic characteristics of the audio signal so as to generate masking information of the audio signal. The quantization unit 120 quantizes the spectral coefficients so as to output quantization indices of the spectral coefficients. In this case, the quantization unit 120 determines a quantization step-size of each frequency band in accordance with the masking information and quantizes the spectral coefficients in accordance with the quantization step-size. The quantization unit 120 may use various quantizing methods such as a prediction quantizing method in order to improve the quantizing performance. The lossless coding unit 130 codes the quantization indices of the spectral coefficients so as to generate a bitstream that is transmitted through a storage medium or a communication channel.

Figure 1B:
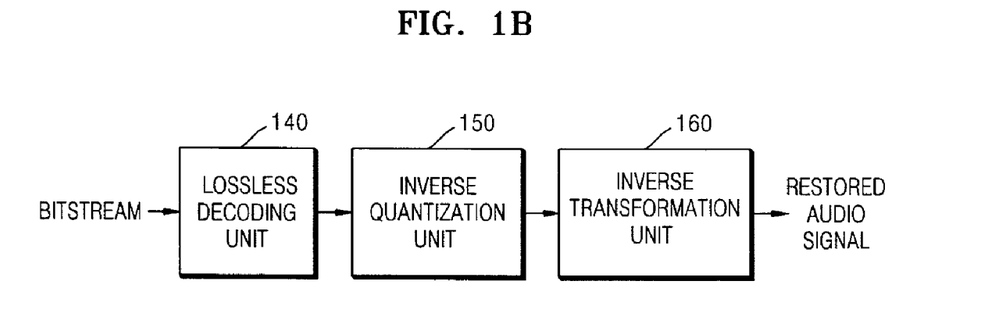
FIG. 1B is a block diagram for explaining a general concept of an audio decoder.

FIG. 1B is a block diagram for explaining a general concept of an audio decoder that corresponds to the audio coder illustrated in FIG. 1A. Referring to FIG. 1B, the audio decoder includes a lossless decoding unit 140, an inverse quantization unit 150, and an inverse transformation unit 160.

The lossless decoding unit 140 decodes a bitstream transmitted through a storage medium or a communication channel so as to extract quantization indices. The inverse quantization unit 150 inversely quantizes the quantization indices so as to calculate spectral coefficients. The inverse transformation unit 160 transforms the spectral coefficients from the frequency domain to the time domain so as to ultimately restore an audio signal.

In the audio coder illustrated in FIG. 1A, when lossless coding is performed, input data to be coded is generally referred to as a symbol, inverse conversion may be performed between an input symbol and an output code (that is, the input symbol may be restored from the output code), and coding without additional distortion is referred to as lossless coding. An object of lossless coding is to code a plurality of input symbols so as to have the least amounts of bits. In general, when lossless coding is performed by using quantization indices of spectral coefficients as the symbols, an entropy coding method such as a Huffman coding method or an arithmetic coding method is used.

Frequency characteristics greatly differ in accordance with the types of audio signals and have large differences between frames in the same audio signal. Also, the spectral coefficients of a general audio signal have different frequency characteristics in accordance with frequency bands. For example, the spectral coefficients of a high frequency band have different frequency characteristics from those of a low frequency band. In order to improve the lossless coding performance, a statistical model that is suitable for a symbol has to be used. If the statistical model is not suitable for the symbol, the lossless coding performance greatly deteriorates. However, as described above, an audio signal includes a plurality of symbols having very different characteristics and, if the audio signal is coded by using one statistical model, the detailed characteristics of each symbol may not be reflected and thus the lossless coding performance may deteriorate.

Thus, in an environment having various characteristics regarding the symbols, a method of improving coding performance is required. In a general Huffman coding method, in order to solve the above problem, a plurality of Huffman tables may be provided. That is, a plurality of Huffman tables are generated by using different statistical models and coding is performed by selecting the Huffman tables which are suitable for the symbols. In this case, overhead bits are required to transfer information of the Huffman table selected for the symbols, and thus it is inefficient to select a Huffman table for each symbol. Accordingly, in general, the symbols are divided into a plurality of groups and a Huffman table is selected for each of the groups. As such, although an overhead bit is additionally required for each of the groups, a total number of bits required for the coding may be reduced by using the statistical models which are suitable for the groups.

In the above-described method, the same coding method is applied to all the groups and only the statistical models are selectively used. However, if a coding method that is the most suitable for symbols of each group is selected from among a plurality of coding methods and a suitable statistical model is also selected in order to perform the selected coding method, the performance of the coding may be improved in comparison to a case when only the statistical models are selected. In this case, the coding methods have fundamental differences from each other and the coding performance deteriorates by using one coding method and is improved by using another coding method. Thus, if only the Huffman coding method and the arithmetic coding method are used as the coding methods, because the two coding methods are similar to each other in that entropy coding is directly performed on the symbols, the coding performance may not be effectively improved.

As described above, improvement of the coding performance may be restrictive if a plurality of coding methods having similar characteristics are selectively used and a new coding method having different characteristics has to be included in the coding methods in order to maximize the improvement of the coding performance by selectively using the coding methods. For example, a new coding method of converting a flow of symbols into a new symbol and coding the new symbol is required instead of a conventional coding method of coding values of symbols.

SUMMARY OF THE INVENTION

The present invention provides a lossless audio coding/decoding apparatus and method in which an audio signal may be compressed into a bitstream having a small number of bits at the same coding distortion rate so as to improve the performance of an audio coder.

The present invention also provides a computer readable recording medium having recorded thereon a computer program for executing a lossless audio coding/decoding method.

According to an aspect of the present invention, there is provided a lossless coding apparatus including a first coder to directly code first symbols; a second coder module comprising a plurality of second coders to convert the first symbols into second symbols and code the second symbols; a first selector to compare the performance of the first coder to the performance of the second coders and output a coding mode in accordance with a comparison result; and a second selector to output a final bitstream by coding the first symbols in correspondence with the coding mode.

According to another aspect of the present invention, there is provided a lossless coding method including directly coding first symbols; converting the first symbols into second symbols and coding the second symbols; comparing a result of the converting of the first symbols and a result of the coding of the second symbols and determining a coding mode in accordance with a comparison result; and generating a final bitstream by coding the first symbols in correspondence with the coding mode.

According to another aspect of the present invention, there is provided a lossless decoding apparatus including a selection mode analyzation unit to analyze an input selection mode and divide and provide a bitstream in accordance with an analysis result; a first decoder to restore first symbols by directly decoding the bitstream provided by the selection mode analyzation unit in correspondence with the selection mode; a second decoder module including a plurality of second decoders to perform code inverse conversion and symbol inverse conversion and decode the bitstream provided by the selection mode analyzation unit in correspondence with a region mode included in the selection mode by using second decoders corresponding to identification modes included in the selection mode; and a combiner to restore the first symbols by combining a result of the decoding of the first decoder and a result of the decoding of the second decoders in correspondence with the selection mode.

According to another aspect of the present invention, there is provided a lossless decoding method including analyzing an input selection mode and dividing and providing a bitstream to a first decoder and a plurality of second decoders performing code inverse conversion and symbol inverse conversion in accordance with an analysis result; restoring first symbols by directly decoding the bitstream provided to the first decoder in correspondence with the selection mode; decoding the bitstream provided to the second decoders in correspondence with a region mode included in the selection mode by using second decoders corresponding to identification modes included in the selection mode; and restoring the first symbols by combining a decoding result of the first decoder and a decoding result of the second decoders in correspondence with the selection mode.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Hereinafter, the present invention will be described in detail by explaining embodiments of the invention with reference to the attached drawings.

According to an embodiment of the present invention, it is assumed that audio coder and decoder as in FIGS. 1A and 1B perform loss coding by inputting quantization indices of spectral coefficients as symbols. Concepts and operations of the present invention may be applied to predetermined data instead of the spectral coefficients. The spectral coefficients are merely an example of the symbols and the scope of the present invention includes operations on every type of input symbols.

According to an embodiment of the present invention, when a plurality of first symbols to be coded are input, a first coder directly performs Huffman coding or arithmetic coding on the first symbols, and a plurality of second coders convert the first symbols into second symbols in accordance with a predetermined rule and code the second symbols by applying various statistical models to the second symbols.

Meanwhile, in accordance with the following Equation 1, the second coders may generate the second symbols by calculating bit values $Q_k[n]$ of a level k of first symbols x[n], connecting the bit values $Q_k[n]$ of each level, and generating a one-dimensional (1D) bitstream B[i] or by converting the 1D bitstream B[i] into a run length stream B[m]. Here, n is a variable representing each component of the first symbols x[n] and i and m are variables representing components of the second symbols. Meanwhile, when the bit values $Q_k[n]$ are generated, two directions may be used for each level. The 1D bitstream B[i] and the run length stream B[m] are differently generated in accordance with each of the two directions and thus the number of bits required to perform coding is different. Accordingly, various types of the 1D bitstream B[i] may be generated by selecting a bit arrangement direction at each level or varying an arrangement order for one-dimensionally connecting the bit values $Q_k[n]$ of each level. For example, if the first symbols x[n] are quantization indices of spectral coefficients, a bit arrangement order of a current level may be opposite to that of a neighboring level by arranging bits in an increasing order of frequencies at the current level and in a decreasing order of frequencies at the neighboring level. The second coders code the generated second symbols. In this case, the second coders may code the second symbols by applying different statistical models to each level. Also, the second coders may divide the second symbols into a plurality of groups and may code the groups by applying different statistical models to the groups.

$$Q_k|n| = \begin{cases} 1 & \text{if } x|n| > k \\ 0 & \text{else if } x|n| = k \\ \text{null} & \text{else} \end{cases} \quad (1)$$

Meanwhile, the first symbols x[n] are restored from the 1D bitstream B[i] in accordance with Equations 2 and 3.

$$Q_k|n| = \begin{cases} B|i++| & \text{if } k \text{ and } n \neq \text{null} \\ 0 & \text{else} \end{cases} \quad (2)$$

$$x[n] = \sum_{k=0} Q_k[n] \quad (3)$$

In order to improve the performance of a plurality of coders, symbols are divided into a plurality of groups and the coders are selectively used for the groups. For example, an optimum Huffman table for each group is selected from among a plurality of Huffman tables so as to perform Huffman coding on the group.

A basic method of determining a coder for each group is to code each group by separately using the coders and to select a coder that requires the minimum number of bits from among the coders. In general, if the number of groups increases, the number of overhead bits required to transfer information of a coder of each group also increases. Thus, the performance of the coders may even deteriorate by selectively using the coders such that the symbols have to be divided into an appropriate number of groups. Furthermore, the second coders using Equation 1 generate the 1D bitstream B[i] by arranging information of the first symbols x[n] in a counter direction and thus a progressive pattern of the first symbols x[n] is utilized as very important information. Accordingly, a very small number of first symbols are included in a predetermined group, an arrangement characteristic of the first symbols may not be easily reflected to the second coders and thus an effect for selectively using coders is reduced. Furthermore, if the second coders are selectively used on non-sequential groups of symbols, pieces of information on the symbols which are not actually sequential are connected into a 1D bitstream and thus the performance of the second coders is reduced. In order to solve the above-described problems, a method of selectively using the second coders may be applied to a plurality of groups each including a large number of sequential first symbols.

According to an embodiment of the present invention, when the lossless coding is performed, two selecting operations are used. In a first operation, first symbols are divided into a plurality of groups in accordance with a rule defined by a general first coder in order to code each group by the first coder. In this case, the first coder selects and uses an optimized statistical model for each group. Then, the first symbols are converted into second symbols regardless of the groups. In this case, a plurality of second coders which use at least one of different symbol conversion methods and different coding methods in accordance with the statistical models from each other are all activated and then an optimized second coder is selected. Then, the performances of the first coder and the second coders are compared to each other and a coder having a superior performance is selected from among the first coder and the second coders. The first coder is selected in a coding mode 0 and the second coders are selected in a coding mode 1.

In a second operation, if the coding mode 0 is selected in the first operation, the second operation is not performed. In this case, all the first symbols are coded by the general first coder. If the coding mode 1 is selected in the first operation, the groups of the first symbols are divided into a plurality of regions, for example, three regions in accordance with an order of the groups. Front and back regions are coded by the first coder and a middle region is coded by one of the second coders. As described above, the second coders use at least one different symbol conversion method or one different coding method in accordance with the statistical models from each other. The second coders are applied to the middle region of each of available region division structures and second coders having optimized performance are selected. A result of the selecting is defined as the performance of the second coders for a corresponding region division structure. Then, a total number of bits required to code entire regions is measured by calculating the number of bits required to code the front and back regions of each region division structure by the first coder such that a region division structure having an optimized performance is obtained. As such, each of the second coders connects sequential groups of the first symbols to each other regardless of the groups, converts the connected groups of the first symbols to the second symbols, and codes the second symbols. Symbols to which the second coders are applied have to be sequential so as to satisfy characteristics required by the second coders.

According to an embodiment of the present invention, the number of cases of the region division structures corresponding to the coding mode 1 in the second operation may be determined variably as shown in Table 1. Here, N is a total number of groups and groups included in each region are defined.

TABLE 1

| Region Division Structure | Groups Included in Front Region to which First Coder is Applied | Groups Included in Middle Region to which Second Coders are Applied | Groups Included in Back Region to which First Coder is Applied |
|---|---|---|---|
| Region Mode 1.0 | — | 0~N-1 | — |
| Region Mode 1.1 | — | 0~N-2 | N-1 |
| Region Mode 1.2 | — | 0~N-3 | N-2, N-1 |
| Region Mode 1.3 | 0 | 1~N-1 | — |
| Region Mode 1.4 | 0 | 1~N-2 | N-1 |
| Region Mode 1.5 | 0 | 1~N-3 | N-2, N-1 |
| Region Mode 1.6 | 0, 1 | 2~N-1 | — |
| Region Mode 1.7 | 0, 1 | 2~N-2 | N-1 |
| Region Mode 1.8 | 0, 1 | 2~N-3 | N-2, N-1 |
| Region Mode 1.9 | 0, 1, 2 | 3~N-1 | — |
| Region Mode 1.10 | 0, 1, 2 | 3~N-2 | N-1 |
| Region Mode 1.11 | 0, 1, 2 | 3~N-3 | N-2, N-1 |
| Region Mode 1.12 | 0, 1, 2, 3 | 4~N-1 | — |

TABLE 1-continued

| Region Division Structure | Groups Included in Front Region to which First Coder is Applied | Groups Included in Middle Region to which Second Coders are Applied | Groups Included in Back Region to which First Coder is Applied |
| --- | --- | --- | --- |
| Region Mode 1.13 | 0, 1, 2, 3 | 4~N-2 | N-1 |
| Region Mode 1.14 | 0, 1, 2, 3 | 4~N-3 | N-2, N-1 |
| Region Mode 1.15 | 0, 1, 2, 3, 4 | 5~N-1 | — |

As shown in Table 1, the maximum numbers of groups which may be coded by the first coder in the front and back regions are respectively five and two. An optimized structure is selected from among the sixteen region division structures.

In a case of Table 1, the number of required overhead bits may be calculated as described below. Here, it is assumed that only one second coder exists such that an overhead bit for selecting a second coder from among a plurality of second coders does not exist. Also, it is assumed that the first coder uses a Huffman coding method that is generally used in an advanced audio coding (AAC) standard. In the AAC standard, 1024 spectral coefficients are divided into a plurality of frequency bands and frequency bands which use the same Huffman table are defined as a section. In the present invention, the section is defined as a group. For simplicity of explanation, it is assumed that each group is composed of thirty two frequency bands to the maximum and five bits are requires to define each group. Furthermore, a group using the first coder consumes four bits in order to define a Huffman table and thus each group using the first coder requires nine overhead bits (4+5=9). Accordingly, the number of required overhead bits when the coding mode 0 is selected in the first operation is one and additional overhead bits are variably required as shown in Table 2 when the coding mode 1 is selected.

TABLE 2

| Type of Overhead Bits | Purpose | No. of Bits |
| --- | --- | --- |
| First Bit Group | for determining one of coding modes 0 and 1 | 1 |
| Second Bit Group | for determining one of region modes 1.0 through 1.15 | 4 |
| Third Bit Group | for defining groups to which the first coder is applied | No. of Groups * 5 |
| Fourth Bit Group | for defining Huffman tables used by groups to which the first coder is applied | No. of Groups * 4 |

Accordingly, the number of required overhead bits varies in accordance with a selected coding mode and a selected region mode. One overhead bit is required to the minimum (when the coding mode 0 is selected) and fifty nine overhead bits are required to the maximum (when a region mode 1.14 of the coding mode 1 is selected). However, by selectively using a plurality of coders performing different coding methods, the number of bits which is larger than the number of required overhead bits may be reduced and thus the performance of the lossless coding may be increased by using a lossless coding apparatus according to the present invention.

Figure 2:
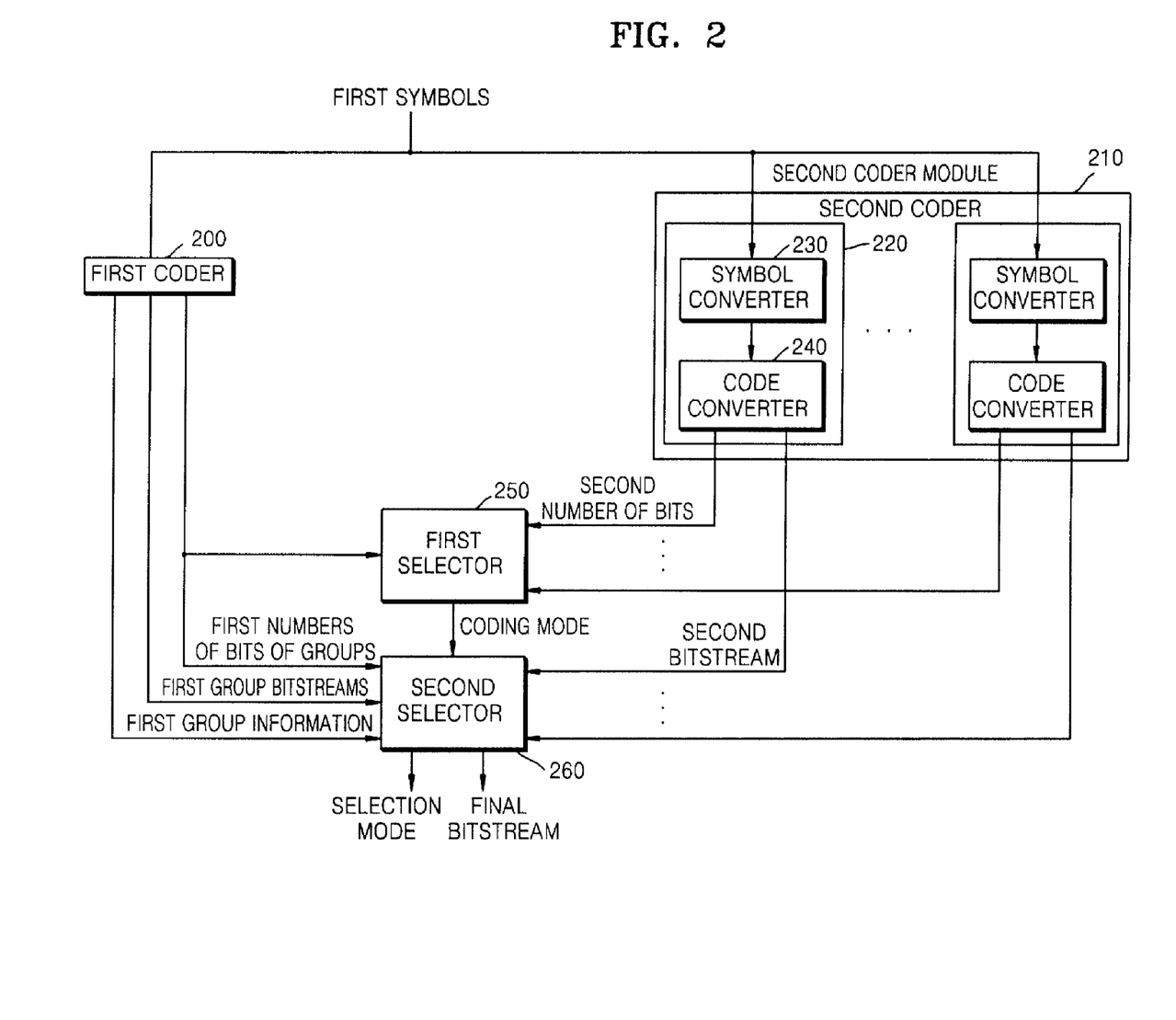
FIG. 2 is a block diagram of a lossless coding apparatus according to an embodiment of the present invention.

FIG. 2 is a block diagram of a lossless coding apparatus according to an embodiment of the present invention. Referring to FIG. 2, the lossless coding apparatus includes a first coder 200, a second coder module 210, a first selector 250, and a second selector 260.

The first coder 200 performs optimized coding on input first symbols in accordance with a general lossless coding method so as to output first group information, first group bitstreams, and first numbers of bits of groups. The first group information defines a group structure in which the first symbols are divided into a plurality of groups.

The second coder module 210 includes a plurality of second coders 220 and the second coders 220 separately include a plurality of symbol converters 230 and a plurality of code converters 240. The symbol converters 230 receive the first symbols and obtain and output second symbols by using various methods including a method of converting the first symbols into a bitstream in accordance with Equation 1 or converting the bitstream into a run length stream. The code converters 240 code the second symbols by using different statistical models so as to output a second bitstream and second numbers of bits. The second coders 220 use at least one of a different symbol conversion method of the symbol converters 230 or a different code conversion method of the code converters 240 from each other. Here, the code conversion method may differ in accordance with an applied statistical model.

The first selector 250 compares a sum of the first numbers of bits of the groups which are output from the first coder 200 to the second numbers of bits which are output from the second coders 220 respectively so as to select a coder having the minimum number of bits from among the first coder 200 and the second coders 220. Then, the first selector 250 determines and outputs a coding mode in accordance with a result of the selecting. The coding mode may be a coding mode 0 that indicates that a performance of the first coder 200 is superior to that of the second coders 220 or a coding mode 1 that indicates the performance of the second coders 220 is superior to that of the first coder 200.

The second selector 260 performs the above-described second operation of selecting in accordance with the coding mode output from the first selector 250 so as to output a final selection mode and a final bitstream. In this case, if the selected coding mode is the coding mode 0, the final selection mode output from the second selector 260 includes information on the selected coding mode, that is, a first bit group shown in Table 2 and the final bitstream is the bitstream obtained by the first coder 200. However, if the selected coding mode is the coding mode 1, the final selection mode output from the second selector 260 includes information on the selected coding mode, that is, the first bit group shown in Table 2, a region mode, that is, a second bit group shown in Table 2, and identification modes of the second coders 220 in a corresponding region mode, and the final bitstream is composed of partial bitstreams corresponding to front and back regions of the bitstream obtained by the first coder 200 and the second bitstream obtained by the second coders 220 which corresponds to a middle region. The selection mode includes third and fourth bit groups shown in Table 2.

Figure 3:
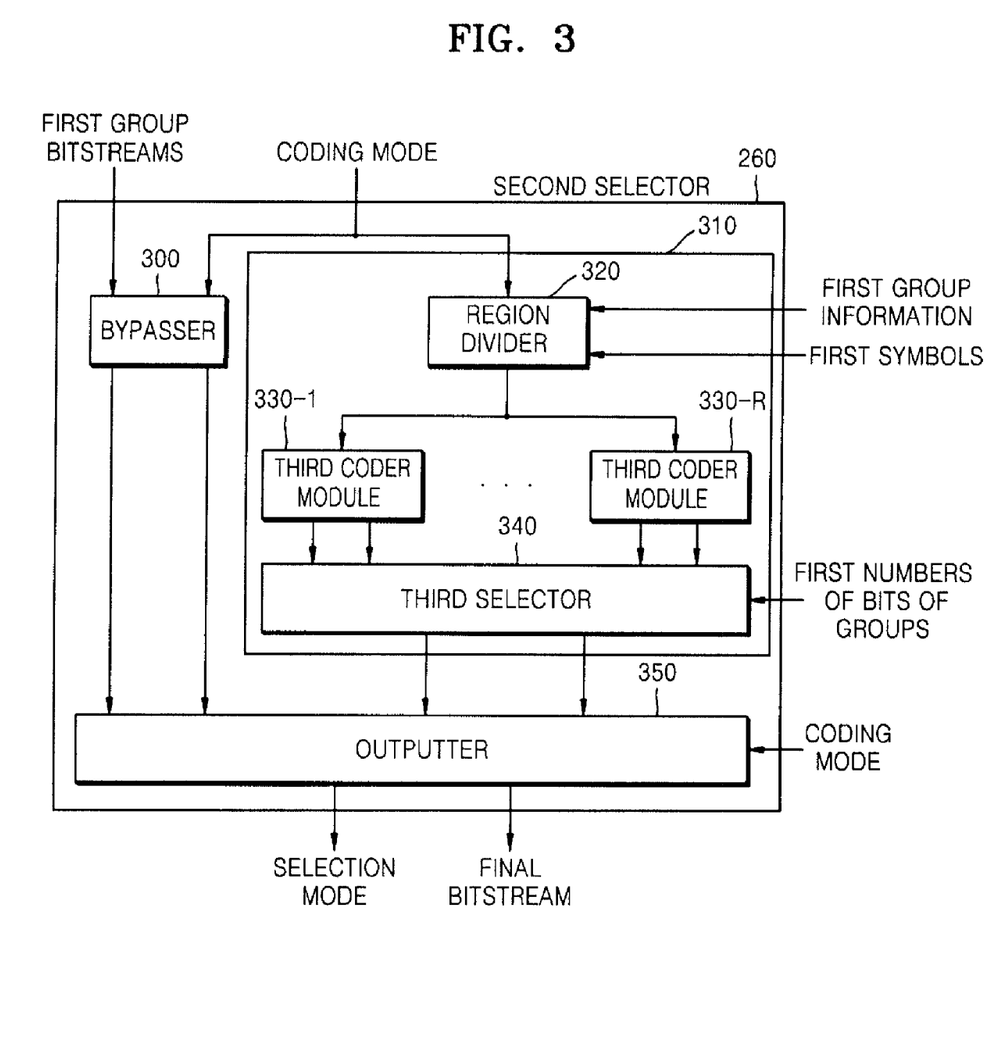
FIG. 3 is a detailed block diagram of a second selector illustrated in FIG. 2, according to an embodiment of the present invention.

FIG. 3 is a detailed block diagram of the second selector 260 illustrated in FIG. 2, according to an embodiment of the present invention. FIG. 3 will be described in conjunction with FIG. 2. Referring to FIG. 3, the second selector 260 includes a bypasser 300, a detail mode determinator 310, and an outputter 350. The detail mode determinator 310 includes a region divider 320, a plurality of third coder modules 330-1 through 330-R, and a third selector 340.

The bypasser 300 receives first group bitstreams provided by the first coder 200 and a coding mode provided by the first selector 250, and bypasses the first group bitstreams and the coding mode. The bypasser 300 outputs the coding mode as a first intermediate selection mode and outputs the first group bitstreams as a first intermediate bitstream.

The detail mode determinator 310 determines identification modes of the second coders 220 having an optimized performance by applying the second coders 220 to a middle region in each of a plurality of region modes of the first symbols, measures a total number of bits required to code entire regions by calculating the number of bits required when front and back regions are coded by the first coder 200 in each region mode, and determines a region mode having an optimized performance from among the region modes.

In more detail, the region divider 320 receives the first symbols, first group information provided by the first coder 200, and the coding mode provided by the first selector 250, operates if the coding mode is a coding mode 1, that is, the second coders 220 are selected. The region divider 320 divides entire groups into three regions including the front, middle, and back regions in accordance with the first group information. In this case, the front region may include zero through p groups to the maximum and the back region may include zero through q groups to the maximum. As such, a total number of available region modes is determined to be $(p+1) \times (q+1)$, and thus the number of region modes to be actually used is defined to be $R \leq (p+1) \times (q+1)$. That is, each region mode defines an intermediately connected group structure and is defined by start and end groups. Thus, a total of R different start-end combinations exist. Accordingly, the region divider 320 separately defines and outputs R third symbols included in the R region modes from among the first symbols.

The R third coder modules 330-1 through 330-R receive corresponding third symbols and perform the same operations as the second coder module 210. Each of the third coder modules 330-1 through 330-R selects one of the second coders 220 and outputs a corresponding second intermediate bitstream including an identification mode of a selected second coder, and a first intermediate number of bits.

The third selector 340 calculates a total number of required bits in each of the R region modes determined by the region divider 320 by summing the first intermediate number of bits, first numbers of bits of groups corresponding to the front and back regions which are excluded in each region mode, and the number of required overhead bits. Then, the third selector 340 selects a region mode having the least total number of bits from among the R region modes and outputs a corresponding second intermediate bitstream and a second intermediate selection mode including the coding mode, the selected region mode, and the identification mode of the selected second coder.

The outputter 350 selects one of the first intermediate selection mode output from the bypasser 300 and the second intermediate selection mode output from the third selector 340 in accordance with the coding mode so as to the selected one as a final selection mode. Also, the outputter 350 combines the first intermediate bitstream output from the bypasser 300 and the second intermediate bitstream output by the third selector 340 so as to output a final bitstream. That is, if the coding mode is the coding mode 0, the outputter 350 outputs the first intermediate selection mode and the first intermediate bitstream as the final selection mode and the final bitstream, respectively. However, if the coding mode is the coding mode 1, the outputter 350 outputs the second intermediate selection mode as the final selection mode and outputs the final stream by combining partial bitstreams corresponding to the front and back regions of the first intermediate bitstream and the second bitstream corresponding to the middle region in correspondence with the second intermediate selection mode.

Figure 4:
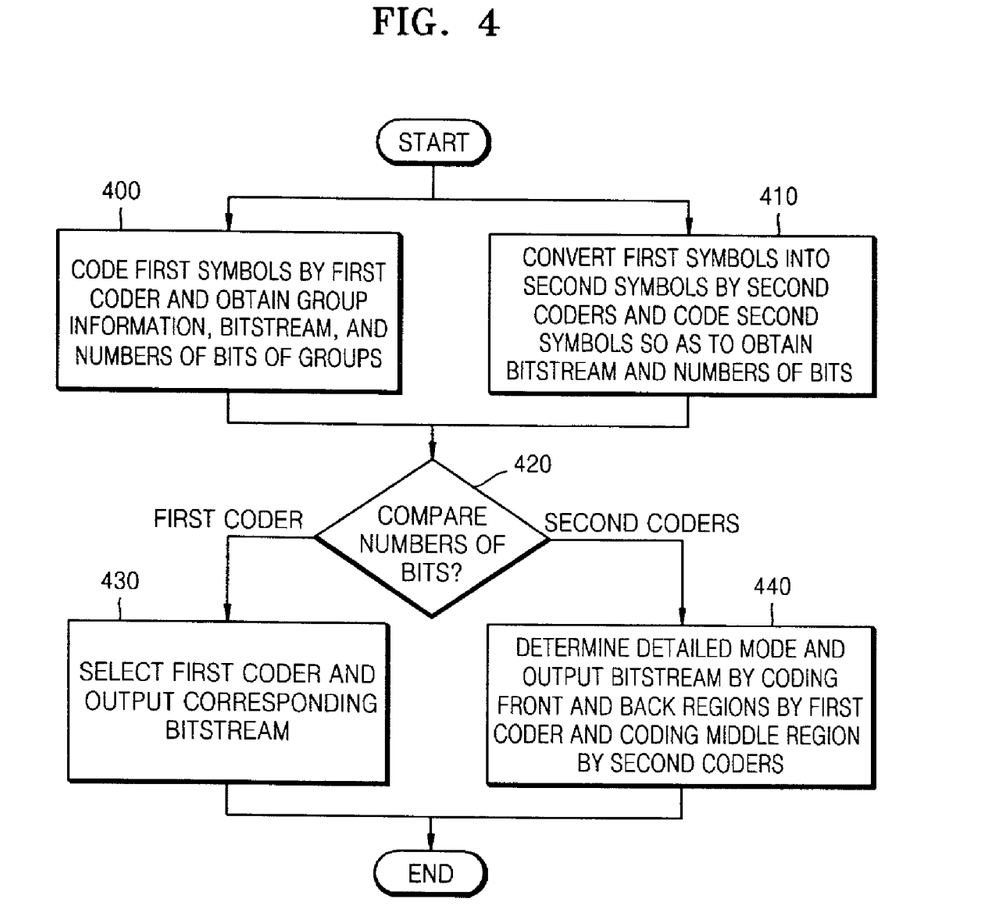
FIG. 4 is a flowchart of a lossless coding method according to an embodiment of the present invention.

FIG. 4 is a flowchart of a lossless coding method according to an embodiment of the present invention.

Referring to FIG. 4, in operation 400, first symbols are coded by a first coder and group information, a bitstream, and a plurality of numbers of bits of groups are obtained. In operation 410, the first symbols are converted into second symbols by a plurality of second coders and the second symbols are coded so as to obtain a bitstream and a plurality of numbers of bits.

In operation 420, a coder having the least number of bits is selected from among the first coder and the second coders by comparing the numbers of bits obtained in operation 400 to those obtained in operation 401. If the first coder is selected, that is, a coding mode 0 is selected, in operation 430, the coding mode 0 is output as a final selection mode and the bitstream obtained in operation 400 is output. If the second coders are selected, that is, a coding mode 1 is selected, in operation 440, a detailed mode including a region mode and identification modes of the second coders are determined and a final bitstream obtained by coding front and back regions by the first coder and coding a middle region by the second coders in accordance with the region mode and the identification modes of the second coders, is output.

Figure 5:
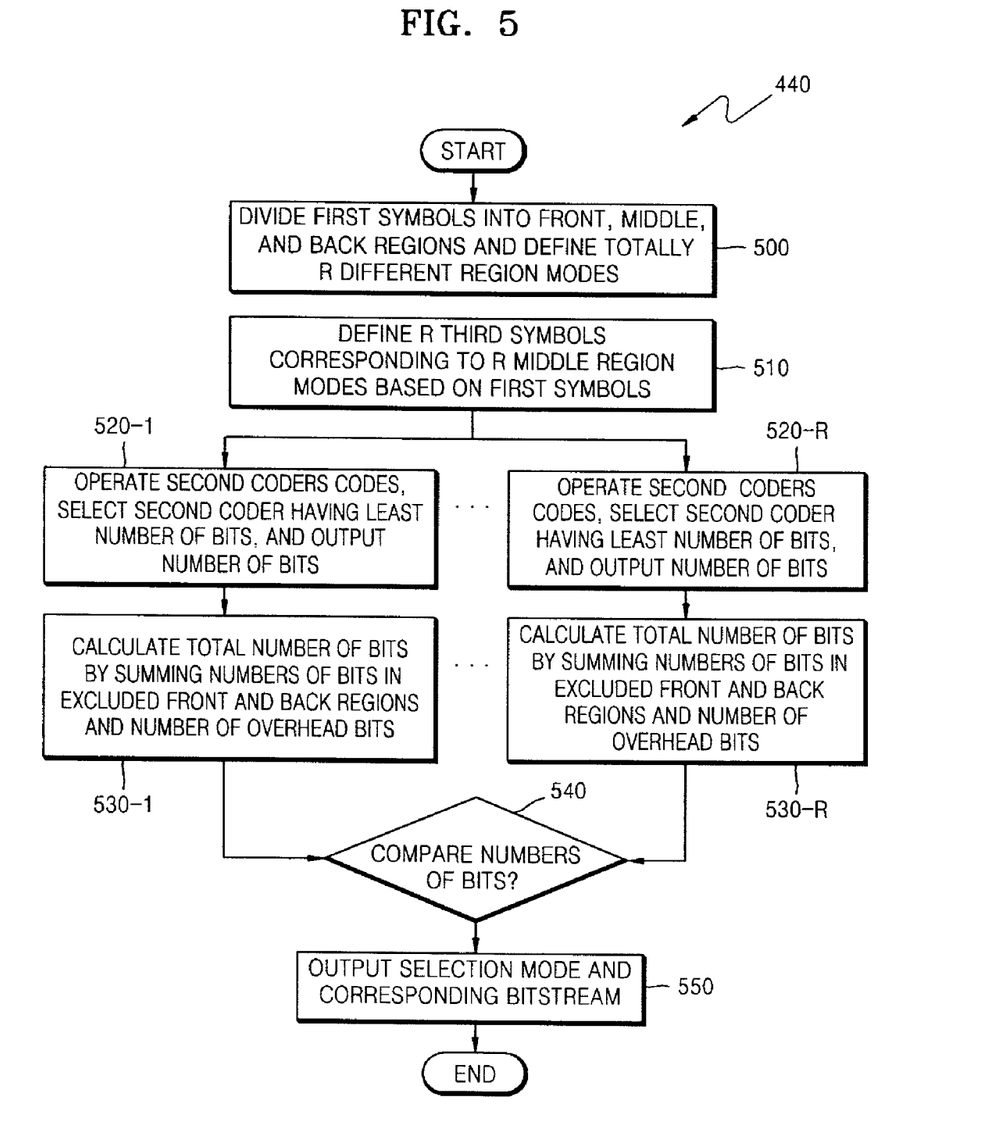
FIG. 5 is a detailed flowchart of operation 440 illustrated in FIG. 4, according to an embodiment of the present invention.

FIG. 5 is a detailed flowchart of operation 440 illustrated in FIG. 4, according to an embodiment of the present invention. FIG. 5 will be described in conjunction with FIG. 4.

Referring to FIG. 5, in operation 500, entire groups of first symbols are divided into front, middle, and back regions based on group information obtained in operation 400, and R different region modes in total are defined in accordance with numbers of groups included in the front and back regions. In operation 510, R third symbols corresponding to the R region modes are defined based on the first symbols.

In operation 520, each of a plurality of second coders codes each of the R third symbols as in operation 410 such that a second coder having the least number of bits is selected and the number of bits and a corresponding bitstream including an identification mode of the selected second coder are output. In operation 530, the number of bits in each of the R region modes is calculated by summing the number of bits obtained in operation 520, first numbers of bits of groups corresponding to the front and back regions coded by a first coder which are excluded in each region mode, and the number of required overhead bits.

In operation 540, a region mode having the least number of bits is selected by comparing the numbers of bits of the R region modes. In operation 550, a final selection mode is determined by including the selected region mode and identification modes of the second coders, and a corresponding bitstream is output.

Figure 6:
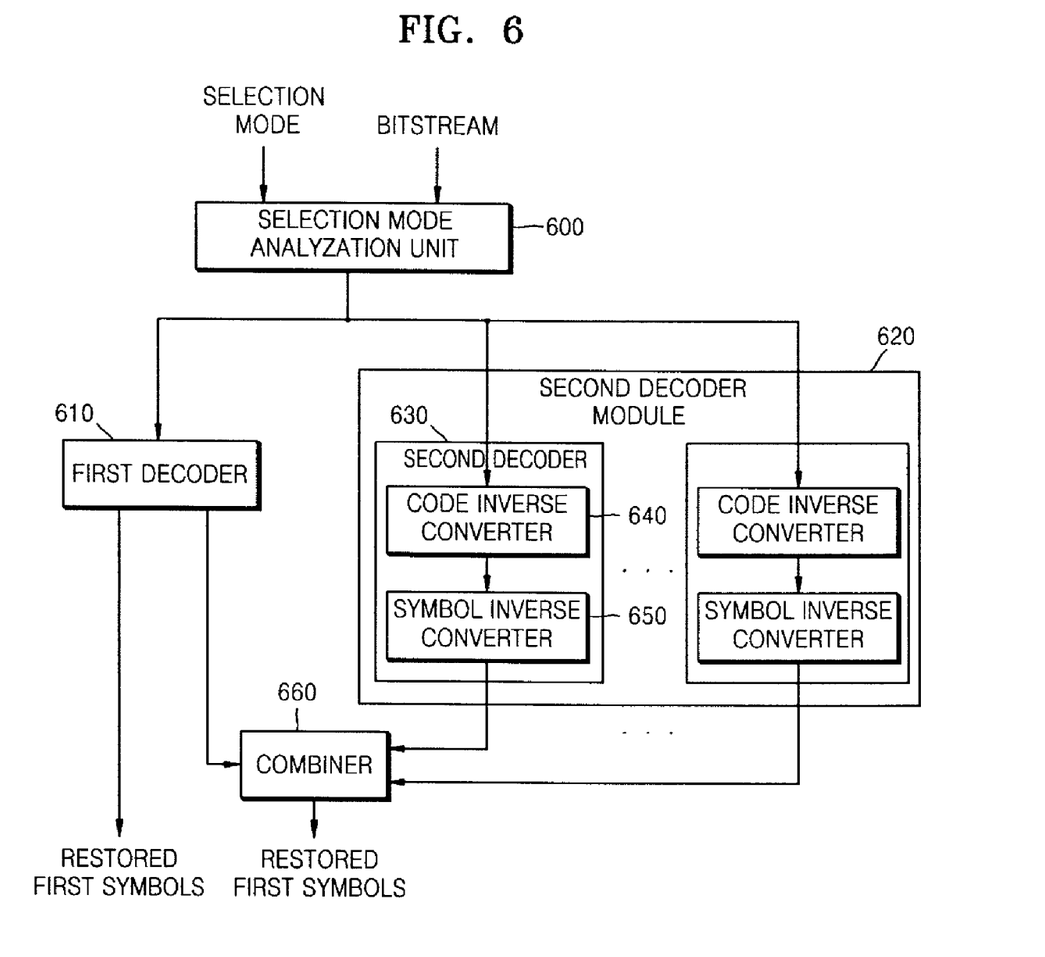
FIG. 6 is a block diagram of a lossless decoding apparatus according to an embodiment of the present invention.

FIG. 6 is a block diagram of a lossless decoding apparatus according to an embodiment of the present invention. Referring to FIG. 6, the lossless decoding apparatus includes a selection mode analyzation unit 600, a first decoder 610, a second decoder module 620, and a combiner 660.

The selection mode analyzation unit 600 receives an input selection mode and an input bitstream and analyzes the selection mode. If the selection mode includes only a coding mode, the bitstream is provided to the first decoder 610. If selection mode includes a detailed mode as well as the coding mode, the bitstream is divided into a plurality of regions so as to be provided to the first decoder 610 and the second decoder module 620 in accordance with a region mode included in the selection mode. That is, in correspondence with the region mode, front and back regions are provided to the first decoder 610 and a middle region is provided to a corresponding second coder of a plurality of second coders 630 of the second decoder module 620.

The first decoder 610 corresponds to the first coder 200 illustrated in FIG. 2 and decodes the whole bitstream or groups corresponding to the front and back regions of the bitstream in accordance with the region mode. For example, if the selection mode includes a coding mode 0, the first decoder 610 decodes the whole bitstream in groups and outputs restored first symbols. If the selection mode includes a coding mode 1, the first coder decodes the groups corresponding to the front and back regions of the bitstream in accordance with the region mode.

The second decoder module 620 corresponds to the second coder module 210 illustrated in FIG. 2 and includes a plurality of second decoders 630. The second decoders 630 separately include a plurality of code inverse converters 640 corresponding to the code converters 240 illustrated in FIG. 2 and a plurality of symbol inverse converters 650 corresponding to the symbol converters 230 illustrated in FIG. 2. The second decoder module 620 decodes groups corresponding to the middle region by using corresponding second decoders from among the second decoders 630 in accordance with identification modes of the second decoders 630 which are included in the selection mode.

If the selection mode includes the coding mode 1, the combiner 660 outputs the first symbols restored by combining the groups corresponding to the front and back regions of the bitstream which are decoded by the first decoder 610 and the groups corresponding to the middle region which are decoded by the second decoders 630.

Figure 7:
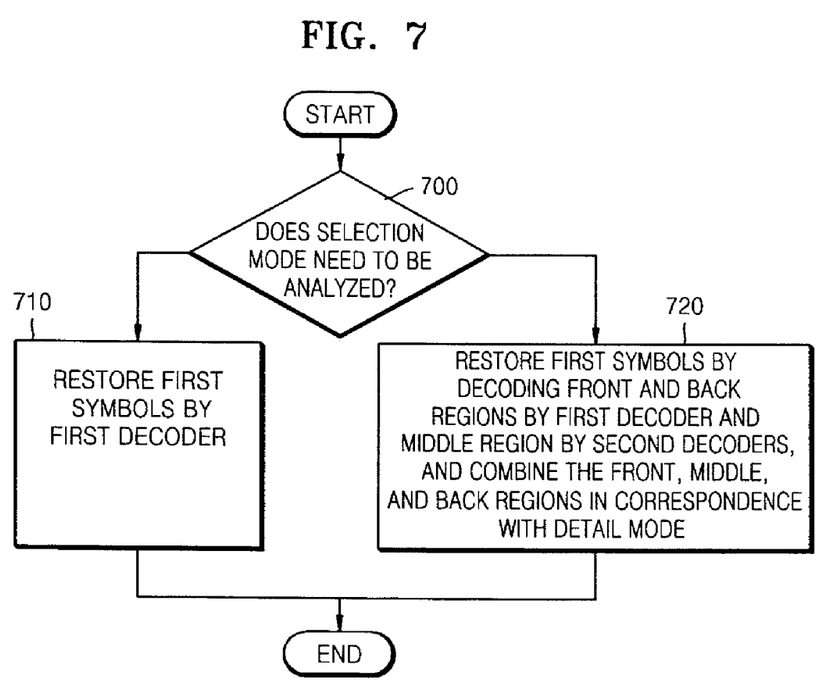
FIG. 7 is a flowchart of a lossless decoding method according to an embodiment of the present invention.

FIG. 7 is a flowchart of a lossless decoding method according to an embodiment of the present invention.

Referring to FIG. 7, in operation 700, a bit rate is provided by analyzing an input selection mode in order to perform decoding operations which are dualized in accordance with the selection mode. In operation 710, if the selection mode includes a coding mode 0, a bitstream is decoded in groups by a first decoder so as to restore first symbols. If the selection mode includes a coding mode 1, in accordance with a region mode included in the selection mode, groups corresponding to front and back regions of the bitstream are decoded by the first decoder and groups corresponding to a middle region of the bitstream are decoded by second decoders corresponding to identification modes. Then, the groups corresponding to the front, middle, and back regions are combined so as to restore the first symbols.

Figure 8:
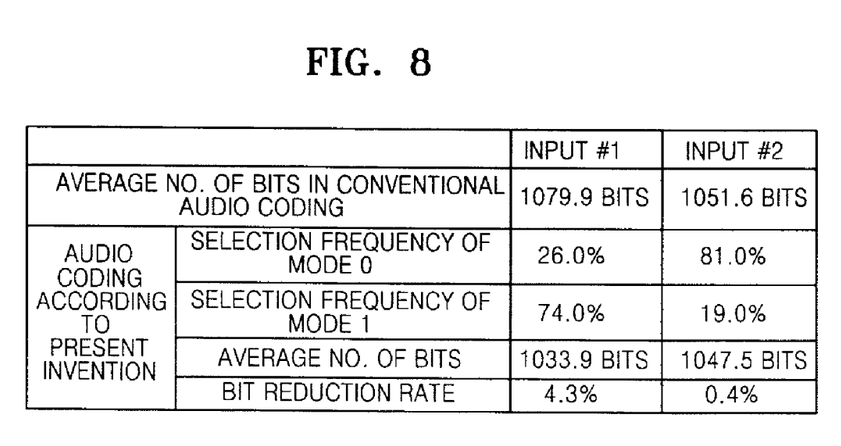
FIG. 8 is a table for comparing performance of a conventional lossless coding apparatus to that of a lossless coding apparatus according to an embodiment of the present invention.

FIG. 8 is a table for comparing performance of a conventional lossless coding apparatus to that of a lossless coding apparatus according to an embodiment of the present invention which is actually applied to spectral coefficients.

1024 spectral coefficients of each of two audio input signals INPUT #1 and INPUT #2 having different characteristics from each other were calculated in frames in accordance with operations of the conventional audio coder illustrated in FIG. 1A and the spectral coefficients were quantized in frequency bands in accordance with masking information. Thus, quantization indices of the spectral coefficients were obtained. Then, selective coding was performed in accordance with operations of the lossless coding apparatus illustrated in FIGS. 2 and 3 and thus results were obtained as shown in FIG. 8. Referring to FIG. 8, 4.3% and 0.4% of bit reduction gains were respectively obtained on the audio input signals INPUT #1 and INPUT #2 in comparison to the performance of the conventional audio coder. As a result, the performance of the whole lossless coding apparatus was increased.

The above-described present invention includes a computer readable medium storing a program instruction for executing various operations realized by a computer. The computer readable medium may include a program instruction, a data file, and a data structure, separately or cooperatively. The program instructions and the media may be those specially designed and constructed for the purposes of the present invention, or they may be of the kind well known and available to those skilled in the art of computer software arts. Examples of the computer readable media include magnetic media (e.g., hard disks, floppy disks, and magnetic tapes), optical media (e.g., CD-ROMs or DVD), magneto-optical media (e.g., floptical disks), and hardware devices (e.g., ROMs, RAMs, or flash memories, etc.) that are specially configured to store and perform program instructions. The media may also be transmission media such as optical or metallic lines, wave guides, etc. including a carrier wave transmitting signals specifying the program instructions, data structures, etc. Examples of the program instructions include both machine code, such as produced by a compiler, and files containing high-level languages codes that may be executed by the computer using an interpreter.

As described above, according to the present invention, the performance of lossless coding of spectral coefficients may be improved by providing a plurality of optimized lossless coding methods having different operation structures and characteristics in order to code a plurality of input symbols having different characteristics and selectively using the optimized lossless coding methods in accordance with the characteristics of the input symbols. Thus, an audio signal may be compressed by using a less number of bitstreams at the same coding distortion. Furthermore, when a target number of bits is fixed, the performance of an audio coder may be improved by reducing distortion at the same compression rate.

While the present invention has been particularly shown and described with reference to exemplary embodiments thereof, it will be understood by those of ordinary skill in the art that various changes in form and details may be made therein without departing from the spirit and scope of the invention as defined by the appended claims. The exemplary embodiments should be considered in a descriptive sense only and not for purposes of limitation. Therefore, the scope of the invention is defined not by the detailed description of the invention but by the appended claims, and all differences within the scope will be construed as being included in the present invention.

What is claimed is:

1. A lossless coding apparatus comprising:
   a first coder to directly code first symbols;
   a second coder module comprising a plurality of second coders to convert the first symbols into second symbols and to code the second symbols;
   a first selector to compare the performance of the first coder to the performance of the second coders and to output a coding mode in accordance with a comparison result; and
   a second selector to output a final bitstream by coding the first symbols in correspondence with the coding mode.

2. The lossless coding apparatus of claim 1, wherein the second coders calculate bit values of each level of the first symbols, and generate the second symbols using a one-dimensional (1D) bitstream obtained by connecting the bit values of each level.

3. The lossless coding apparatus of claim 1, wherein the second coders calculate bit values of each level of the first symbols, generate a 1D bitstream by connecting the bit values of each level, convert the 1D bitstream into a run length stream, and generates the second symbols.

4. The lossless coding apparatus of claim 1, wherein the second coders use at least one different method of converting the first symbols into the second symbols or one different statistical models used for coding the second symbols.

5. The lossless coding apparatus of claim 2, wherein the second coders generate the 1D bitstream by varying an arrangement order or an arrangement direction for one-dimensionally connecting the bit values of each level.

6. The lossless coding apparatus of claim 2, wherein each of the second coders codes the second symbols by applying different statistical models to each level.

7. The lossless coding apparatus of claim 2, wherein each of the second coders divides the second symbols into a plurality of groups and codes the second symbols by applying different statistical models to the groups.

8. The lossless coding apparatus of claim 1, wherein the second selector comprises:
a bypasser to bypass the coding mode and a first bitstream received from the first coder;
a detail mode determinator to determine a region mode and identification modes of the second coders which have an optimized performance on the first symbols, and to output a second bitstream from the second coders in correspondence with the determined region mode and identification modes; and
an outputter to output the final bitstream by combining the first bitstream and the second bitstream in correspondence with the coding mode, the region mode, and the identification modes.

9. The lossless coding apparatus of claim 8, wherein the detail mode determinator comprises:
a region divider to divide the first symbols into first and second groups in accordance with a plurality of region modes;
a plurality of third coder modules to code the second group by the second coders in accordance with each of the region modes; and
a third selector to select a region mode having the least number of bits from among the region modes and to select one of identification modes of the second coders by comparing a result of coding the first group by the first coder to a result of coding the second group by the second group in each region mode and outputting the second bitstream.

10. The lossless coding apparatus of claim 9, wherein the region divider defines front and back regions of the first symbols as the first group and defines a remaining region of the first symbols as the second group.

11. The lossless coding apparatus of claim 1, wherein the second selector outputs a selection mode and the final bitstream, and
wherein the selection mode includes only the coding mode or includes the coding mode, a region mode, and identification modes of the second coders.

12. A lossless coding method comprising:
directly coding first symbols;
converting the first symbols into second symbols and coding the second symbols;
comparing a result of the coding of the first symbols and a result of the coding of the second symbols and determining a coding mode in accordance with a comparison result; and
generating a final bitstream by coding the first symbols in correspondence with the coding mode.

13. The lossless coding method of claim 12, wherein the converting of the first symbols into the second symbols comprises calculating bit values of each level of the first symbols and generating a one-dimensional (1D) bitstream by connecting the bit values of each level.

14. The lossless coding method of claim 13, wherein the converting of the first symbols into the second symbols further comprises converting the 1D bitstream into a run length stream.

15. The lossless coding method of claim 13, wherein the converting of the first symbols into the second symbols comprises generating the 1D bitstream by varying an arrangement order or an arrangement direction for one-dimensionally connecting the bit values of each level.

16. The lossless coding method of claim 12, wherein the coding of the second symbols comprises coding the second symbols by applying different statistical models to the second symbols.

17. The lossless coding method of claim 12, wherein the generating of the final bitstream comprises:
bypassing the coding mode and a first bitstream received from a first coder;
determining a region mode and identification modes of the second coders which have an optimized performance on the first symbols, and generating a second bitstream from a plurality of second coders in correspondence with the determined region mode and identification modes; and
generating the final bitstream by combining the first bitstream and the second bitstream in correspondence with the coding mode, the region mode, and the identification modes.

18. The lossless coding method of claim 17, wherein the generating of the second bitstream comprises:
dividing the first symbols into first and second groups in accordance with a plurality of region modes;
directly coding the first group, converting the second group into the second symbols, and coding the second symbols in accordance with each of the region modes; and
selecting a region mode having the least number of bits from among the region modes and selecting one of identification modes of the second coders by comparing a result of coding the first group by the first coder to a result of coding the second group by the second group in each region mode and outputting the second bitstream.

19. The lossless coding method of claim 18, wherein the first group is defined as front and back regions of the first symbols and the second group is defined as a remaining region of the first symbols.

20. The lossless coding method of claim 12, wherein a selection mode and the final bitstream are output in the generating of the second bitstream, and
wherein the selection mode includes only the coding mode or includes the coding mode, a region mode, and identification modes of coders.

21. A lossless decoding apparatus comprising:
a selection mode analyzation unit to analyze an input selection mode and dividing and to provide a bitstream in accordance with a result of the analyzing;
a first decoder to restore first symbols by directly decoding the bitstream provided by the selection mode analyzation unit in correspondence with the selection mode;
a second decoder module including a plurality of second decoders to perform code inverse conversion and symbol inverse conversion and to decode the bitstream provided by the selection mode analyzation unit in correspondence with a region mode included in the selection mode by using second decoders corresponding to identification modes included in the selection mode; and a combiner to restore the first symbols by combining a result of the decoding of the first decoder and a result of the decoding of the second decoders in correspondence with the selection mode.

22. The lossless decoding apparatus of claim 21, wherein the combiner combines front and back regions of the first symbols which are obtained by the first decoder and a middle region of the first symbols which is obtained by the second decoders.

23. A lossless decoding method comprising:

analyzing an input selection mode and dividing and providing a bitstream to a first decoder and a plurality of second decoders performing code inverse conversion and symbol inverse conversion in accordance with an analysis result;

restoring first symbols by directly decoding the bitstream provided to the first decoder in correspondence with the selection mode;

decoding the bitstream provided to the second decoders in correspondence with a region mode included in the selection mode by using second decoders corresponding to identification modes included in the selection mode; and restoring the first symbols by combining a decoding result of the first decoder and a decoding result of the second decoders in correspondence with the selection mode.

24. The lossless decoding method of claim 23, wherein the combining comprises combining a decoding result of the first decoder for front and back regions of the first symbols and a decoding result of the second decoders for a middle region of the first symbols.

25. A computer readable recording medium having recorded thereon a computer program for executing the method of claim 12.

26. A computer readable recording medium having recorded thereon a computer program for executing the method of claim 23.

* * * * *